(12) United States Patent
Soh et al.

(10) Patent No.: US 11,417,848 B2
(45) Date of Patent: Aug. 16, 2022

(54) FOLDABLE DISPLAY DEVICE

(71) Applicant: Samsung Display Co., Ltd., Yongin-si (KR)

(72) Inventors: Yong Kwon Soh, Hwaseong-si (KR); In Soo Park, Hwaseong-si (KR); Jin Yong Sim, Seongnam-si (KR)

(73) Assignee: Samsung Display Co., Ltd., Yongin-si (KR)

(*) Notice: Subject to any disclaimer, the term of this patent is extended or adjusted under 35 U.S.C. 154(b) by 77 days.

(21) Appl. No.: 17/103,732

(22) Filed: Nov. 24, 2020

(65) Prior Publication Data
US 2021/0234107 A1 Jul. 29, 2021

(30) Foreign Application Priority Data

Jan. 29, 2020 (KR) .................. 10-2020-0010460

(51) Int. Cl.
H05K 5/02 (2006.01)
H05K 5/00 (2006.01)
G06F 1/16 (2006.01)
H01L 51/00 (2006.01)
H01L 27/32 (2006.01)

(52) U.S. Cl.
CPC ........ *H01L 51/0097* (2013.01); *H01L 27/323* (2013.01); *H01L 27/3244* (2013.01); *H05K 5/0017* (2013.01); *H05K 5/0226* (2013.01); *H01L 2251/5338* (2013.01)

(58) Field of Classification Search
CPC ............. H01L 51/0097; H01L 27/323; H01L 27/3244; H01L 2251/5338; H01L 51/524; H05K 5/0017; H05K 5/0226; Y02E 10/549; G09F 9/301; F16C 11/04; G06F 1/1652; G06F 2203/04102
See application file for complete search history.

(56) References Cited

U.S. PATENT DOCUMENTS 9,614,168 B2    4/2017  Zhang et al.
10,860,056 B2 * 12/2020  Watamura ............. G06F 1/1643
(Continued)

FOREIGN PATENT DOCUMENTS

KR   10-2016-0035146    3/2016
KR   10-2018-0111281   10/2018
KR   10-2021-0091848    7/2021

*Primary Examiner* — Abhishek M Rathod
(74) *Attorney, Agent, or Firm* — H.C. Park & Associates, PLC

(57) ABSTRACT

A foldable display device includes: a display panel; a first support member on a back surface of the display panel and in a first non-folding area; a second support member on a back surface of the display panel and in a second non-folding area and spaced apart from the first support member; a barrier sheet on back surfaces of the first support member and the second support member to overlap the first non-folding area, a folding axis, and the second non-folding area. The barrier sheet is on the folding axis and includes an extension portion extending along a direction of the folding axis. The first support member includes a first groove portion formed at a corner of the first support member adjacent to the folding axis, and the second support member includes a second groove portion formed at a corner of the second support member adjacent to the folding axis.

20 Claims, 15 Drawing Sheets

(56) References Cited

U.S. PATENT DOCUMENTS

| | | | |
|---|---|---|---|
| 11,073,870 B2* | 7/2021 | Yun | G06F 1/1652 |
| 2018/0292860 A1* | 10/2018 | Siddiqui | G06F 1/1681 |
| 2021/0026406 A1 | 1/2021 | Kim et al. | |
| 2021/0096600 A1* | 4/2021 | Soh | G06F 1/1652 |
| 2021/0144871 A1* | 5/2021 | Araki | H01L 51/5253 |
| 2021/0216106 A1 | 7/2021 | Soh et al. | |

* cited by examiner

FOLDABLE DISPLAY DEVICE

CROSS REFERENCE TO RELATED APPLICATION

This application claims priority from and the benefit of Korean Patent Application No. 10-2020-0010460, filed on Jan. 29, 2020, which is hereby incorporated by reference for all purposes as if fully set forth herein.

BACKGROUND

Field

Exemplary implementations of the invention relate generally to a foldable display device and more specifically, to a foldable display device having a barrier sheet.

Discussion of the Background

A display device for displaying an image includes a display panel such as an organic light emitting display panel including an organic light emitting diode (OLED) or a quantum dot electroluminescence device (QD-EL) or a liquid crystal display panel.

Meanwhile, a mobile electronic appliance includes a display device to provide an image to a user. The proportion of mobile electronic appliances having the same or smaller volume or thickness than conventional mobile electronic appliances and having larger display screen than the conventional mobile electronic appliances has increased, and foldable display devices or bendable display devices having a structure capable of being folded and unfolded have also been developed in order to provide a larger display screen.

A gap may be formed between members used for the exterior or interior of a foldable display device. When foreign matter is introduced into a display panel through the gap, the display panel may be winkled or defected.

The above information disclosed in this Background section is only for understanding of the background of the inventive concepts, and, therefore, it may contain information that does not constitute prior art.

SUMMARY

Applicant has discovered that when foldable display devices having a folding structure are folded or unfolded, foreign matter is easily introduced into the foldable display devices through gaps of the folding structure such that the defective rate thereof is increased.

Display devices constructed according to the principles and exemplary embodiments of the invention are capable of preventing the penetration of the foreign matter by providing a barrier sheet covering the gaps of the foldable structure. For example, the barrier sheet having a cover portion and an extending portion is disposed to cover a gap between separated support members used for the folding structure of the display devices such that the foreign matter is prevented from being introduced into the folding structure.

Additional features of the inventive concepts will be set forth in the description which follows, and in part will be apparent from the description, or may be learned by practice of the inventive concepts.

According to an aspect of the invention, a foldable display device having a first non-folding area and a second non-folding area with a folding axis therebetween includes: a display panel; a first support member disposed on a back surface of the display panel and in the first non-folding area; a second support member disposed on a back surface of the display panel and in the second non-folding area, the second support member spaced apart from the first support member; a barrier sheet disposed on back surfaces of the first support member and the second support member to overlap the first non-folding area, the folding axis, and the second non-folding area, wherein the barrier sheet is disposed on the folding axis and includes an extension portion extending along a direction of the folding axis, and wherein: the first support member includes a first groove portion formed at a corner of the first support member adjacent to the folding axis, and the second support member includes a second groove portion formed at a corner of the second support member adjacent to the folding axis.

The extension portion of the barrier sheet may be bent to be accommodated in a space defined by the first groove portion of the first support member and the second groove portion of the second support member.

The barrier sheet may further include a cover portion covering a space between the first support member and the second support member, and the extension portion of the barrier sheet may include an overlapping portion disposed to overlap the cover portion in a thickness direction of the cover portion, and a bending portion connecting the cover portion and the overlapping portion in the thickness direction.

The bending portion of the barrier sheet may be bent in a direction intersecting the folding axis.

The bending portion of the barrier sheet may have a U-shaped structure having one open side facing toward a center of the foldable display device or facing between the cover portion and the overlapping portion, and has one end connected to the cover portion and another end connected to the overlapping portion.

The bending portion of the barrier sheet may cover a gap between the display panel and the cover portion in the thickness direction.

The bending portion of the barrier sheet may protrude outwardly beyond an edge of the display panel.

The cover portion, the overlapping portion, and the bending portion of the barrier sheet may be folded or unfolded according to a variation of an angle between the first support member and the second support member.

The cover portion of the barrier sheet may be attached to back surfaces of the first support member and the second support member, and the overlapping portion of the barrier sheet is attached to a back surface of the display panel.

The foldable display device may further include: a first adhesive member disposed between the first support member and the barrier sheet; and a second adhesive member disposed between the second support member and the barrier sheet.

The first adhesive member and the second adhesive member are disposed along an edge of the cover portion of the barrier sheet with the overlapping portion therebetween.

Each of the first groove portion and the second groove portion may include a first side surface extending along a direction intersecting the direction of the folding axis and a second side surface extending along the direction of the folding axis.

The extension portion of the barrier sheet may be spaced apart from the first side surface and is in contact with the second side surface.

The foldable display device may further include: an adhesive layer disposed between the overlapping portion of the barrier sheet and the display panel to attach an upper surface of the overlapping portion of the barrier sheet to a lower surface of the display panel.

The foldable display device may further include: a connection portion disposed in a back direction of the barrier sheet and connecting the first support member and the second support member, the connection portion configured to change an angle between the first support member and the second support member.

The connection portion may further include a hinge structure having at least one rotation axis and a hinge cover covering the hinge cover; the barrier sheet is disposed inside the hinge cover; and the extension portion of the barrier sheet covers a gap between an edge of the display panel and an inner side surface of the hinge cover.

According to another aspect of the invention, a foldable display device includes: a display panel; a first support member and a second support member disposed on a back surface of the display panel in a first direction; and a barrier sheet disposed to overlap back surfaces of the first support member and the second support member and including an extension portion extending in a second direction intersecting the first direction, wherein the first support member includes a first groove portion at one side corner of the first support member adjacent to the second support member, the second support member includes a second groove portion at one side corner of the second support member adjacent to the first support member, and the extension portion of the barrier sheet is bent to be disposed in a space defined by the first groove portion of the first support member and the second groove portion of the second support member.

Each of the first groove portion and the second groove portion may include a first side surface extending in the first direction, and a second side surface extending in the second direction.

The foldable display device may further include: a first adhesive member disposed between the first support member and the barrier sheet; and a second adhesive member disposed between the second support member and the barrier sheet.

The foldable display device may further include: a connection portion connecting the first support member and the second support member, the connection portion configured to change an angle between the first support member and the second support member, wherein the connection portion further includes a hinge structure having at least one rotation axis and a hinge cover covering the hinge cover, and the barrier sheet is disposed inside the hinge cover.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
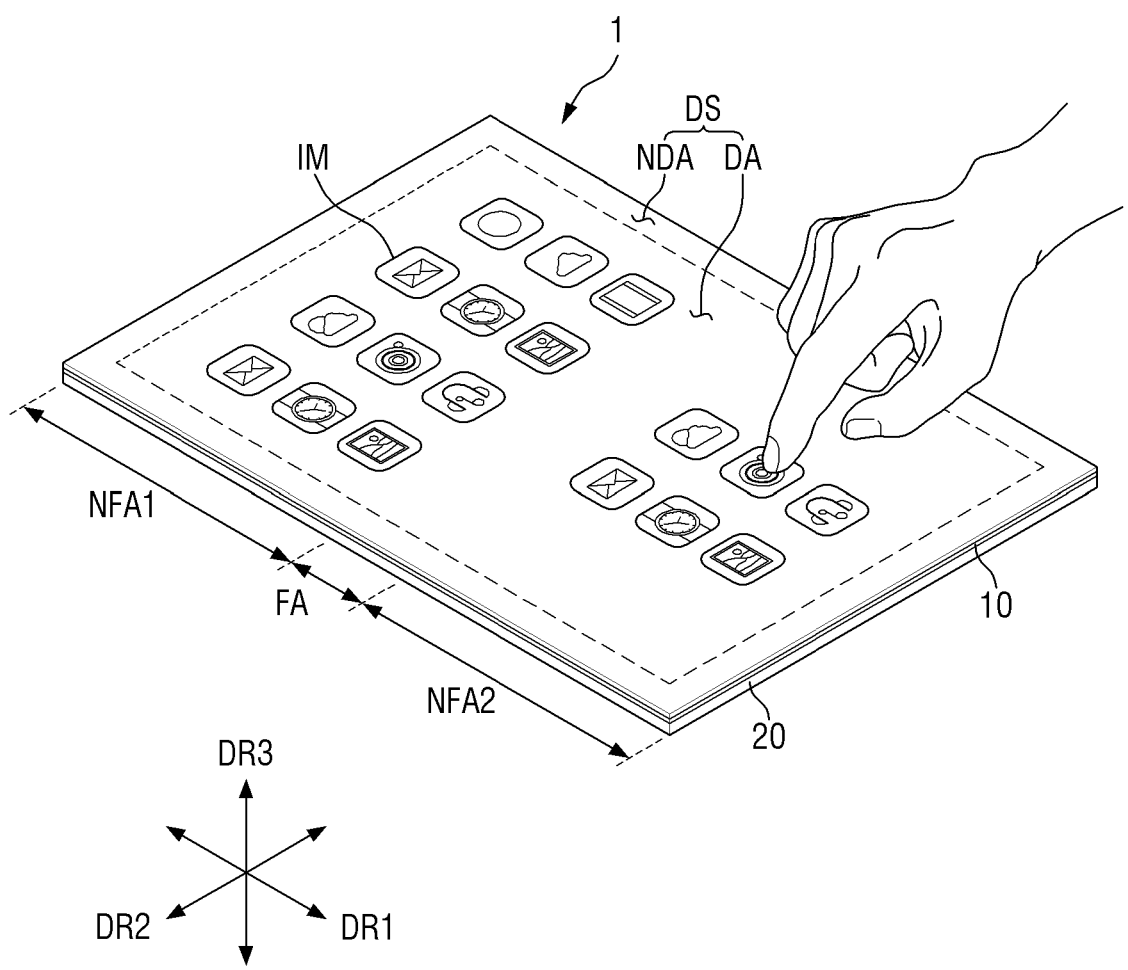
FIG. 1 is a perspective view of an exemplary embodiment of a foldable display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments will be described with reference to the attached drawings.

Figure 2:
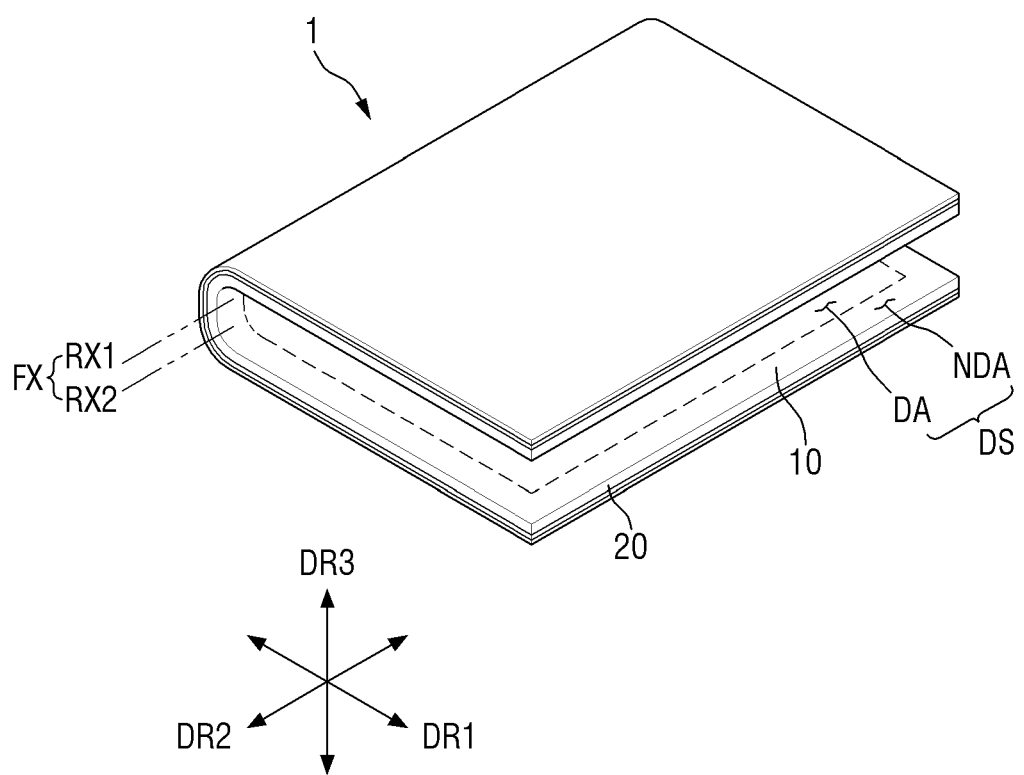
FIG. 2 is a perspective view illustrating a folded state of the foldable display device of FIG. 1.

FIG. 1 is a perspective view of an exemplary embodiment of a foldable display device constructed according to the principles of the invention, and FIG. 2 is a perspective view showing a folded state of the foldable display device of FIG. 1.

In exemplary embodiments, the first direction DR1, the second direction DR2, and the third direction DR3 intersects each other in different directions. In the perspective view of FIG. 1, for convenience of description, the horizontal direction of the foldable display device 1 is defined as the first direction DR1, the vertical direction thereof is defined as the second direction DR2, and the thickness direction thereof is defined as the third direction DR3.

Hereinafter, for convenience of description, the third direction DR3 facing upward in FIG. 1 is referred to as a front direction, and the direction opposite to the front direction is referred to as a back direction. Further, the surface facing in the front direction is referred to as a front surface, and the surface opposite to the front surface is referred to as a back surface. However, the direction mentioned in the exemplary embodiments should be understood to refer to a relative direction, the exemplary embodiments are not limited to the aforementioned direction.

A foldable display device 1 according to an exemplary embodiment may include various devices for displaying a screen or an image. Examples of the foldable display device 1 may include, but are not limited to, foldable smartphones, table PCs, and notebook computers.

Referring to FIGS. 1 and 2, the foldable display device 1 may have a rectangular shape having long sides in the first direction DR1 and short sides in the second direction DR2 intersecting the first direction DR1. However, the exemplary embodiments are not limited thereto, and the foldable display device 1 may have various shapes.

In the foldable display device 1, a display surface DS is defined. For example, as illustrated in FIG. 1, a front surface substantially parallel to the first direction and the second direction may be defined as the display surface DS. Images IM may be provided to the user through the display surface DS.

In the foldable display device 1, a plurality of display surfaces DS may be defined. For example, the plurality of display surfaces DS may be defined on at least two of a front surface, a back surface and side surfaces extending between the front surface and the back surface of the foldable display device 1. Hereinafter, an exemplary embodiment in which the display surface DS is defined on only the one surface will be mainly described, but the exemplary embodiments are not limited thereto.

The display surface DS includes a display area DA and a non-display area NDA around the display area DA. The display area DA may display an image, and the non-display area NDA may not display an image. The non-display area NDA may surround the display area DA and provide an edge portion of the foldable display device 1 formed or printed in a predetermined color.

The display surface DS may be disposed over æ folding area FA and non-folding areas NFA1 and NFA2 to be described later.

The foldable display device 1 may be folded or unfolded. Here, 'folded' may include 'bent'. Specifically, the foldable display device 1 may be configured such that a part overlaps another part, a part is bent to be inclined with respect to another part, or the entire is flattened.

The foldable display device 1 may be folded in a direction in which a part of the front surface thereof faces another part thereof. In other words, a part of the front surface of the foldable display device 1 may be folded to form an angle of less than right angle with respect to another part thereof. For example, the foldable display device 1 may be folded in a direction in which a part of the rear surface thereof faces another part thereof.

The foldable display device 1 may be folded such that a part of the display surface DS faces another part thereof. For example, as shown in FIG. 2, the foldable display device 1 may be folded such that a part of one display surface DS defined on the front surface faces another part thereof. Alternatively, the foldable display device 1 may be folded such that the plurality of display surfaces DS face each other. In other words, the foldable display device 1 may be folded inwardly. Hereinafter, a folded state refers to a state in which the foldable display device 1 is folded inwardly.

The foldable display device 1 may have a folded state or an unfolded state. The folded state includes a state where the foldable display device 1 is bent. Specifically, the folded state may be a state in which a part of the foldable display device 1 is bent so as to be inclined with respect to another part thereof, and the unfolded state may be a state in which a part of the foldable display device 1 is disposed in substantially parallel with another part thereof on one plane. Alternatively, the folded state may be a state in which an angle between a part of the foldable display device 1 and another part thereof is about 0° or more and less than about 180° and/or more than about 180° and less than about 360°, and the unfolded state may be a state in which an angle between a part of the foldable display device 1 and another part thereof is about 180°. Here, a part and another part may be non-folding areas, which will be described later, respectively.

The foldable display device 1 may be divided into a folding area FA and non-folding areas NFA1 and NFA2. The folding area FA is an area that is folded as the foldable is display device 1 is folded. In other words, the folding area FA is an area that is bent as the foldable display device 1 is folded. The non-folding areas NFA1 and NFA2 are areas that are not folded or bent. In other words, the non-folding areas NFA1 and NFA2 may be flat areas regardless of folding of the foldable display device 1. The non-folding areas NFA1 and NFA2 may be arranged in the first direction DR1, and the folding area FA may be disposed between the non-folding areas NFA1 and NFA2. For example, the non-folding areas NFA1 and NFA2 may include a first non-folding area NFA1 and a second non-folding area NFA2. In the illustrated exemplary embodiment, one folding area FA is defined in the foldable display device 1, but the exemplary embodiments are not limited thereto and a plurality of folding areas may be defined in the foldable display device 1.

The foldable display device 1 may be folded or unfolded based on the folding axis FX. For example, the foldable display device 1 may be folded or unfolded based on the folding axis FX disposed in the second direction DR2.

The folding axis FX includes one or more rotation axes RX1 and RX2. The folding axis FX may include a first rotation axis RX1 and a second rotation axis RX2 adjacent to each other. For example, the foldable display device 1 may be folded or unfolded to have two centers of curvature. The first and second rotation axes RX1 and RX2 may be disposed to overlap the folding area FA. The foldable display device 1 may include a display panel 110 and a folding member 20. Hereinafter, the display module 10 and the folding member 20 will be described in detail with reference to FIGS. 3 to 18.

Figure 3:
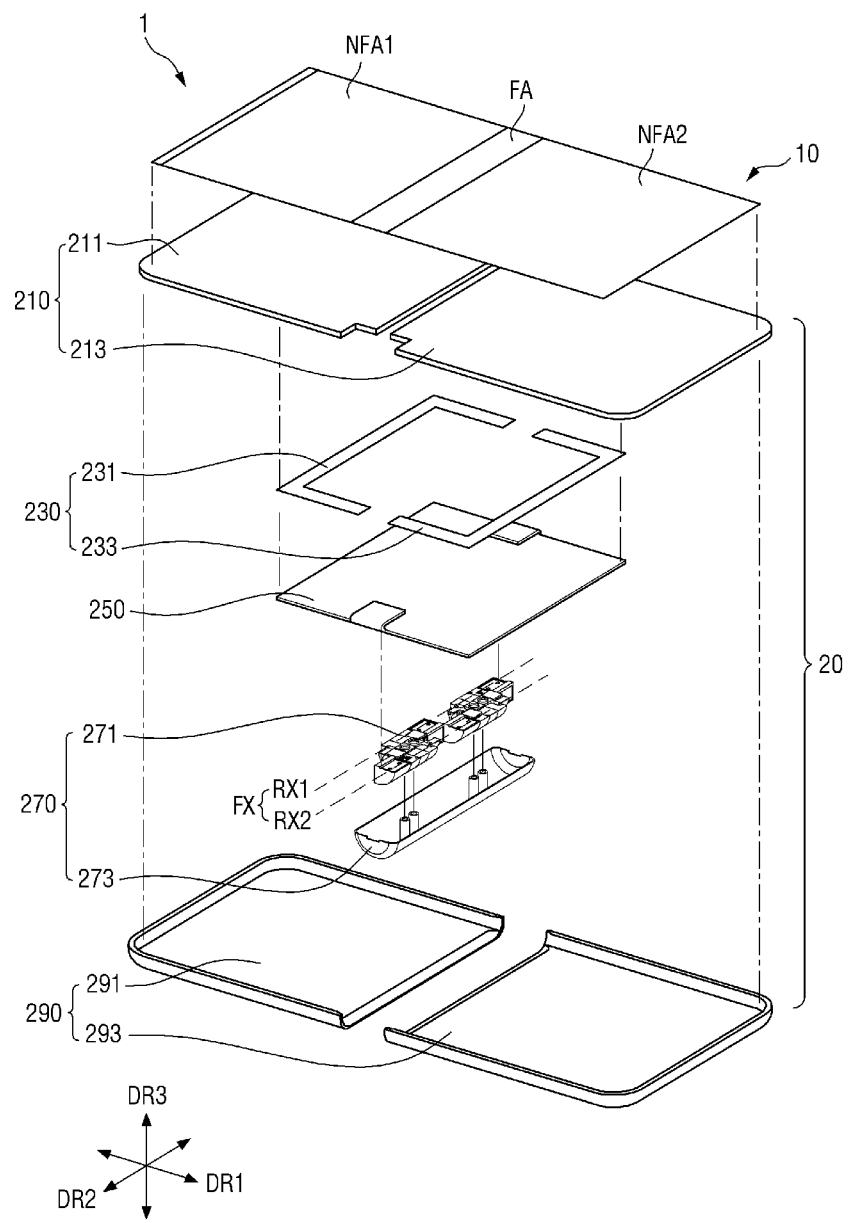
FIG. 3 is an exploded perspective view of the foldable display device of FIG. 1.

FIG. 3 is an exploded perspective view of the foldable display of FIG. 1.

Referring to FIGS. 1, 2, and 3, the foldable display device 1 includes a display module 10 and a folding member 20.

The display module 10 is disposed at the front surface of the foldable display device 1. The display module 10 is flexible. The display module 10 may be disposed over the folding area FA and the non-folding areas NFA1 and NFA2, and may be folded based the folding area FA. Hereinafter, the display module 10 will be described in more detail with reference to FIGS. 4 and 5.

The folding member 20 is disposed at the back surface of the display module 10 and supports the display module 10. The folding member 20 is folded together with the display module 10 as the foldable display device is folded. For example, the display module 10 having flexibility may be folded by the folding member 20.

The folding member 20 may include a support member 210, a barrier sheet 250, an adhesive member 230, a connection portion 270, and a back cover 290.

The support member 210 is disposed on the back surface of the display module 10 to support the display module 10. The support member 210 may support the display module 10 and diffuse the heat generated therein. For example, the support member 210 may be a metal plate including copper, silver, or the like having excellent thermal conductivity. As another example, the support member 210 may be a heat dissipation sheet including graphite or carbon nanotubes. The support member 210 may include a first support member 211 and a second support member 213.

The first support member 211 may be disposed on one side of the second direction DR2 based on the folding axis FX, and the second support member 213 may be disposed on the other side of the second direction DR2 based on the folding axis FX. Specifically, the first support member 211 may be disposed in the first non-folding area NFA1, and the second support member 213 may be disposed in the second non-folding area NFA2. The first support member 211 and the second support member 213 may be disposed to partially overlap the folding area FA. The first support member 211 and the second support member 213 may be disposed to be separated from each other, or may be disposed to be at least partially connected to each other. The first support member 211 and the second support member 213 may be symmetrically disposed with respect to the folding axis FX.

The barrier sheet 250 is disposed in the back direction of the support member 210. The barrier sheet 250 covers a gap between the first support member 211 and the second support member 213. The barrier sheet 250 may be formed of a material having elasticity that is variable in length as the gap between the first support member 211 and the second support member 213 changes. For example, the barrier sheet 250 may include thermoplastic elastomers (TPE) that are elastic and easily processed. As another example, the barrier sheet 250 may include elastic fibers having a mesh structure. Hereinafter, the barrier sheet 250 will be described in more detail with reference to FIGS. 6, 7, and 8.

The adhesive member 230 is disposed between the support member 210 and the barrier sheet 250 to attach the support member 210 to the barrier sheet 250. The adhesive member 230 may be formed as a single layer, may be formed as a plurality of laminated adhesive layers, and may include an adhesive layer, e.g., a double-sided tape, on one side and the other side of the substrate. For example, the adhesive member 230 may include at least one of a silicone adhesive, an acrylic adhesive, a crystalline polymer, or a rubber polymer. Hereinafter, the adhesive member 230 will be described in more detail with reference to FIGS. 6, 7, and 8.

The connection portion 270 is disposed in the back direction of the barrier sheet 250. The connection portion 270 is disposed on the folding axis FX to connect one side of the first support member 211 and one side of the second support member 213, adjacent to the folding axis FX, such that the angle between the first support member 211 and the second support member 213 is changed.

The connection portion 270 may include at least one hinge structure 271 disposed in the second direction DR2 and a hinge cover 273 covering the hinge structure 271 in the back direction of the barrier sheet 250.

The hinge structure 271 may be a multi-axial hinge structure. For example, the hinge structure 271 includes a plurality of brackets and a plurality of gears, and may be driven such that the bracket coupled to the first support member 211 and the bracket coupled to the second support member 213 are rotated in different directions based on the first rotation axis RX1 and the second rotation axe RX2 by the plurality of gears, respectively, as the angle between the first support member 211 and the second support member 213 is changed.

However, exemplary embodiments are not limited to the hinge structure 271. For example, the structure or number of the connection portion 270 is varied. For example, the connection portion 270 may include any structure capable of folding or unfolding the foldable display device 1 by connecting the first support member 211 and the second support member 213 such that the angle between the first support member 211 and the second support member 213 is changed.

The back cover 290 is disposed to face a back surface of the support member 210. The back cover 290 may include a first back cover 291 and a second back cover 293.

The first back cover 291 may be disposed to cover the first support member 211 on the back surface of the first support member 211. The first back cover 291 may disposed to cover a part of the hinge cover 273 (for example, an upper end of the back surface of the hinge cover 273) disposed between the first support member 211 and the second support member 213. The first back cover 291 may have rounded corners. The first back cover 291 may be empty inside or may form an empty space between the first support members 211 while being engaged with the first support members 211. For example, the first back cover 291 may have a structure in which a bottom surface having a quadrangular shape and three sidewalls extending from the bottom surface thereof are formed. For example, one side of the rectangular shape may have an open structure without sidewalls. For example, the second back cover 293 may have the substantially same shape as the first back cover 291. The first back cover 291 and the second back cover 293 may be symmetrically disposed with respect to the second direction DR2.

Hereinafter, the display module 10 will be described in detail with reference to FIGS. 4 and 5.

Figure 4:
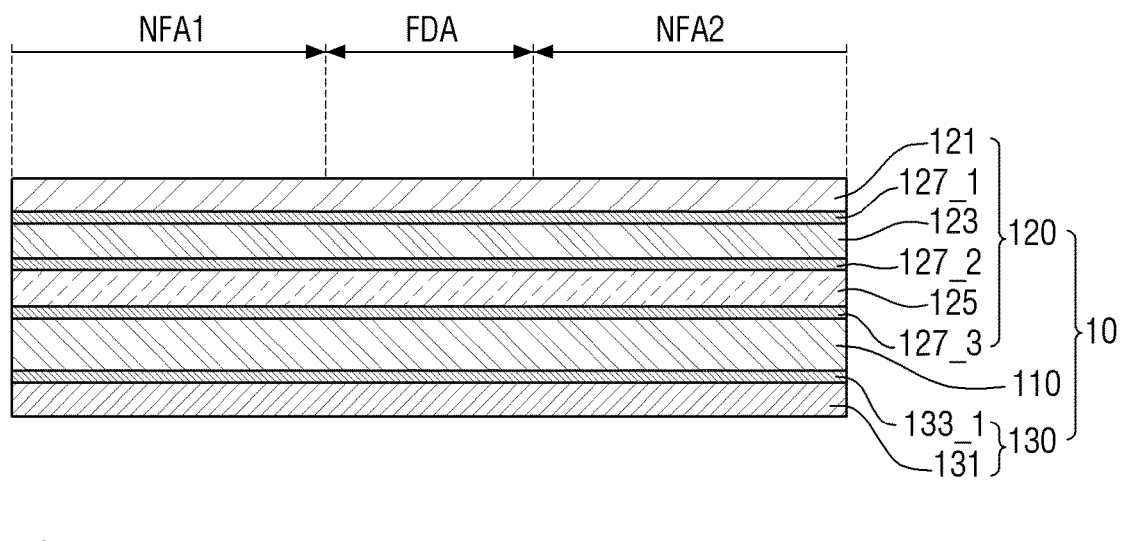
FIG. 4 is a cross-sectional view of a display module of FIG. 3.
Figure 4:
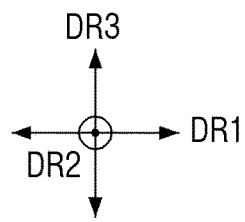
Figure 5:
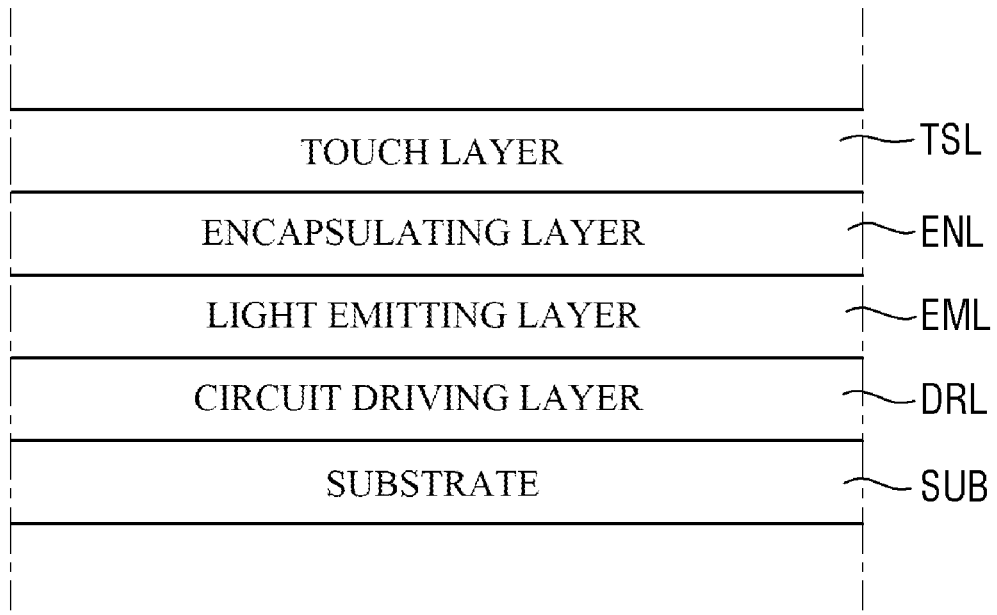
FIG. 5 is a cross-sectional view of a display panel of FIG. 4.

FIG. 4 is a cross-sectional view of a display module of FIG. 3, and FIG. 5 is a cross-sectional view of a display panel of FIG. 4.

FIG. 4 is a cross-sectional view of the display module 10 of FIG. 3, and FIG. 5 is a cross-sectional view of the display panel 110 of FIG. 4.

Referring to FIG. 4, the display module 10 may include the display panel 110, a front laminate structure 120, and a back laminate structure 130. Each of the laminate structures may include at least one coupling member.

The display panel 110 may generate an image and provide the image to the user. For example, the display panel 110 may include self-light emitting display panels such as an organic light emitting display panel (OLED), an inorganic light emitting display panel (inorganic EL), a quantum dot light emitting display panel (QED), a micro LED display panel (micro-LED), a nano LED display panel (nano-LED), a plasma display panel (PDP), a field emission display panel (FED), and a cathode ray display panel (CRT). Further, the display panel 110 may include light receiving display panels such as a liquid crystal display panel (LCD) and an electrophoretic display panel (EPD). Hereinafter, an organic light emitting display panel will be described as an example of the display panel 110. However, exemplary embodiments are not limited to the organic light emitting display panel, and other display panels listed above or known in the art may be used to implement the example embodiments.

The display panel 110 may further include a touch member. The touch member may be provided as a separate panel or a separate film from the display panel 110 and attached to the display panel 110, but may be provided in the form of a touch layer inside the display panel 110. In the following exemplary embodiments, the touch member is provided inside the display panel 110 to be included in the display panel 110, but the exemplary embodiments are not limited thereto.

Referring to FIG. 5, the display panel 110 may include a substrate SUB, a circuit driving layer DRL on the substrate SUB, a light emitting layer EML on the circuit driving layer DRL, an encapsulation layer ENL on the light emitting layer EML, and a touch layer TSL on the encapsulation layer ENL.

The substrate SUB may be a flexible substrate including a flexible polymer material such as polyimide. Thus, the display panel 110 may be warped, bent, folded, or rolled. In some exemplary embodiments, the substrate SUB may include a plurality of sub-substrates overlapping each other in the thickness direction (e.g., the third direction DR3) with the barrier layer interposed therebetween. In this case, each of the sub-substrates may be a flexible substrate.

The circuit driving layer DRL may be disposed on the substrate SUB. The circuit driving layer DRL may include a circuit for driving a light emitting layer EML of a pixel. The circuit driving layer DRL may include a plurality of thin film transistors.

The light emitting layer EML may be disposed on the circuit driving layer DRL. The light emitting layer EML may include an organic light emitting layer. The light emitting layer EML may emit light with various luminance according to a driving signal transmitted from the circuit driving layer DRL.

The encapsulation layer ENL may be disposed on the light emitting layer EML. The encapsulation layer ENL may include an inorganic film or a laminated film of an inorganic film and an organic film.

The touch layer TSL may be disposed on the encapsulation layer ENL. The touch layer TSL is a layer that recognizes a touch input, and may function as a touch member. The touch layer TSL may include a plurality of sensing areas and a plurality of sensing electrodes.

Referring to FIG. 4, the front laminate structure 120 is disposed in the front direction of the display panel 110. The front laminate structure 120 may include a polarizing member 125, a cover window 123, and a cover window protection layer 121, which are sequentially laminated in the front direction from the display panel 110.

The polarizing member 125 polarizes light. The polarizing member 125 may reduce external light reflection. In an exemplary embodiment, the polarizing member 125 may be a polarizing film. The polarizing film may include a polarizing layer and a protective substrate for sandwiching the polarizing layer. The polarizing layer may include polyvinyl alcohol. The polarizing layer may be stretched in one direction. The stretching direction of the polarizing layer may be an absorption axis, and a direction substantially perpendicular thereto may be a transmission axis. The protective substrate may be disposed on one side and the other side of the polarizing layer, respectively. The protective substrate may be made of a cellulose resin such as triacetyl cellulose, a polyester resin, or the like, but the exemplary embodiments are not limited to material thereof.

The cover window 123 may be disposed in the front direction of the polarizing member 125. The cover window 123 may protect the display panel 110. The cover window 123 may be made of a transparent material. For example, the cover window 123 may be made of glass or plastic. When the cover window 123 includes glass, the glass may be ultra-thin glass (UTG) or thin film glass. When the glass is made of an ultra-thin film or a thin film, the glass may have flexible properties to be bent, folded, or rolled. The thickness of the glass may be in a range of about 10 μm to about 300 μm, specifically, about 30 μm to about 80 μm or about 50 μm. The glass of cover window 123 may include soda lime glass, alkali aluminosilicate glass, borosilicate glass, or lithium alumina silicate glass. The glass of cover window 123 may include chemically or thermally strengthened glass to have strong strength. Chemical strengthening may be achieved through an ion exchange treatment process in an alkaline salt. The ion exchange treatment process may be performed two or more times.

When the cover window 123 includes plastic, it may be more advantageous to exhibit flexible properties such as folding. Examples of the plastic applicable to the cover window 123 may include polyimide, polyacrylate, polymethylmethacrylate (PMMA), polycarbonate (PC), polyethylenenaphthalate (PEN), polyvinylidene chloride, polyvinylidene difluoride (PVDF), polystyrene, an ethylene vinylalcohol copolymer, polyethersulphone (PES), polyetherimide (PEI), polyphenylene sulfide (PPS), polyallylate, tri-acetyl cellulose (TAC), and cellulose acetate propionate (CAP). However, exemplary embodiments are not limited thereto. The plastic cover window 123 may be made of at least one of the aforementioned plastic materials.

The cover window protection layer 121 may be disposed in the front direction of the cover window 123. The cover window protection layer 121 may perform at least one function of scattering prevention, shock absorbing, nailing prevention, fingerprint prevention, and anti-glare of the cover window 123. The cover window protection layer 121 may include a transparent polymer film. The transparent polymer film may include at least one of PET (PolyEthylene Terephthalate), PEN (PolyEthylene Naphthalate), PES (Polyether Sulfone), PI (Polyimide), PAR (PolyARylate), PC (PolyCarbonate), PMMA (PolyMethyl MethAcrylate), and COC (CycloOlefin Copolymer).

The front laminate structure 120 may include a plurality of front coupling members 127_1, 127_2, and 127_3 coupling adjacent laminated members.

The back laminate structure 130 is disposed in the back direction of the display panel 110. The back laminate structure 130 may include a polymer film layer 131.

The polymer film layer 131 may include a polymer. For example, the polymer film layer 131 may include polyimide (PI), polyethylene terephthalate (PET), polycarbonate (PC), polyethylene (PE), polypropylene (PP), polysulfone (PSF), polymethyl methacrylate (PMMA), triacetyl cellulose (TAC), or cycloolefin polymer (COP). The polymer film layer 131 may include a functional layer on at least one surface thereof. The functional layer may include, for example, a light absorbing layer. The light absorbing layer may include a light absorbing material such as a black pigment or a dye. The light absorbing layer is made of black ink, and may be formed on the polymer film by coating or printing.

The back laminate structure 130 may include a back coupling member 133_1 that couples the display panel 110 and the polymer layer.

When the foldable display device 1 displays an image only on the front surface, the back coupling member 133_1 is not necessarily optically transparent unlike the front coupling members 127_1, 127_2, and 127_3.

The front coupling members 127_1, 127_2, and 127_3 and the back coupling members 133_1 may each include an adhesive material. The front coupling members 127_1, 127_2, and 127_3 and the back coupling members 133_1 may be formed as a single adhesive layer, may be formed as a plurality of laminated adhesive layers, and may be formed such that, like double-sided tape, one surface and the other surface of a substrate are coated with adhesive layers, respectively.

Hereinafter, the support member 210, the barrier sheet 250, and the adhesive member 230 will be described in detail with reference to FIGS. 6, 7, and 8.

Figure 6:
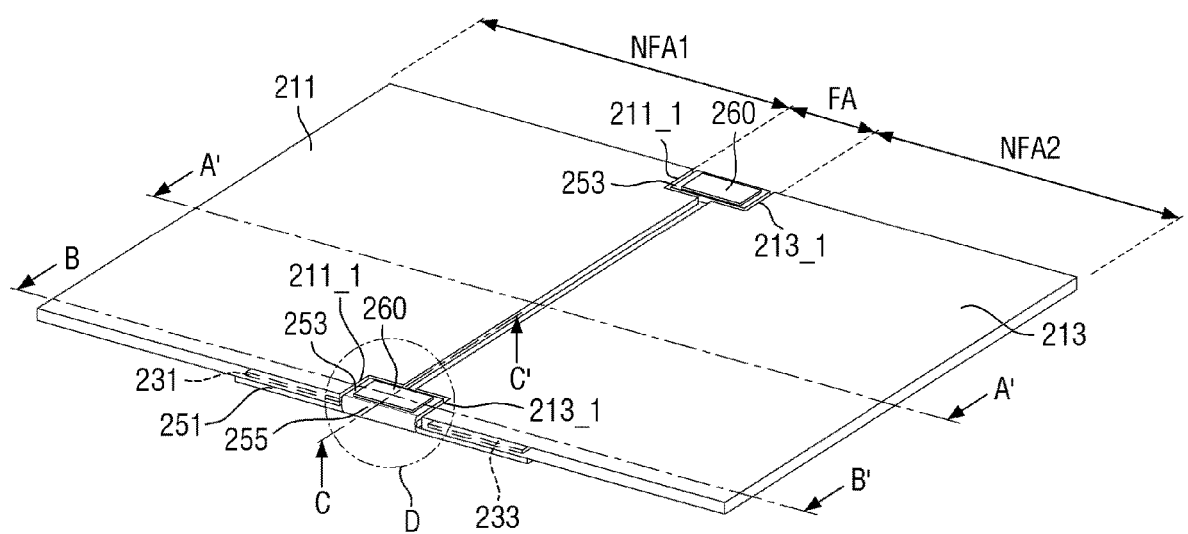
FIG. 6 is a perspective view of a support member, a barrier sheet, and an adhesive member of the foldable display of FIG. 1.
Figure 6:
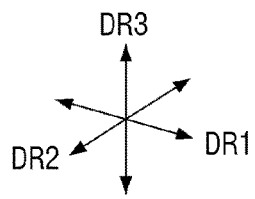
Figure 7:
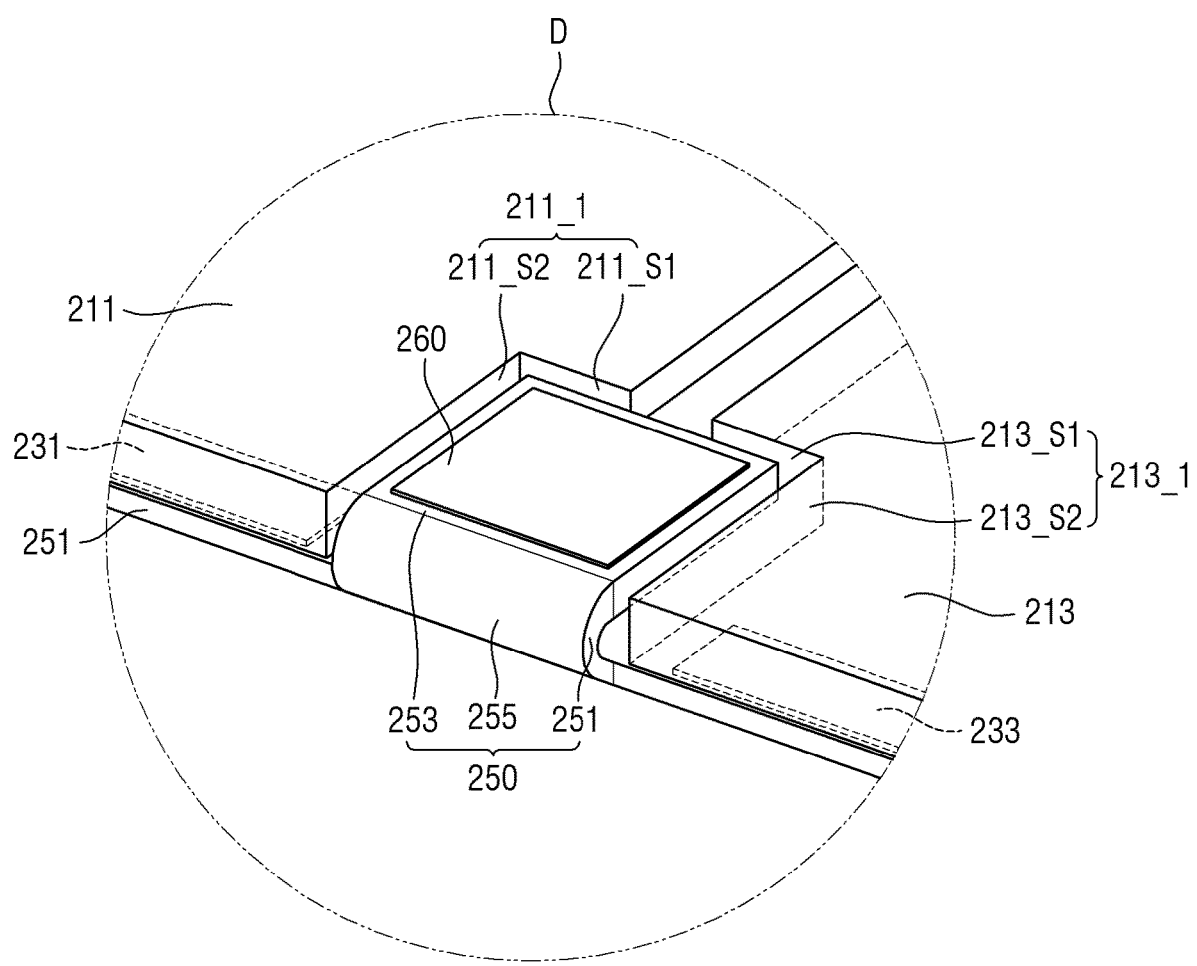
FIG. 7 is an enlarged perspective view of a portion D of FIG. 6.
Figure 8:
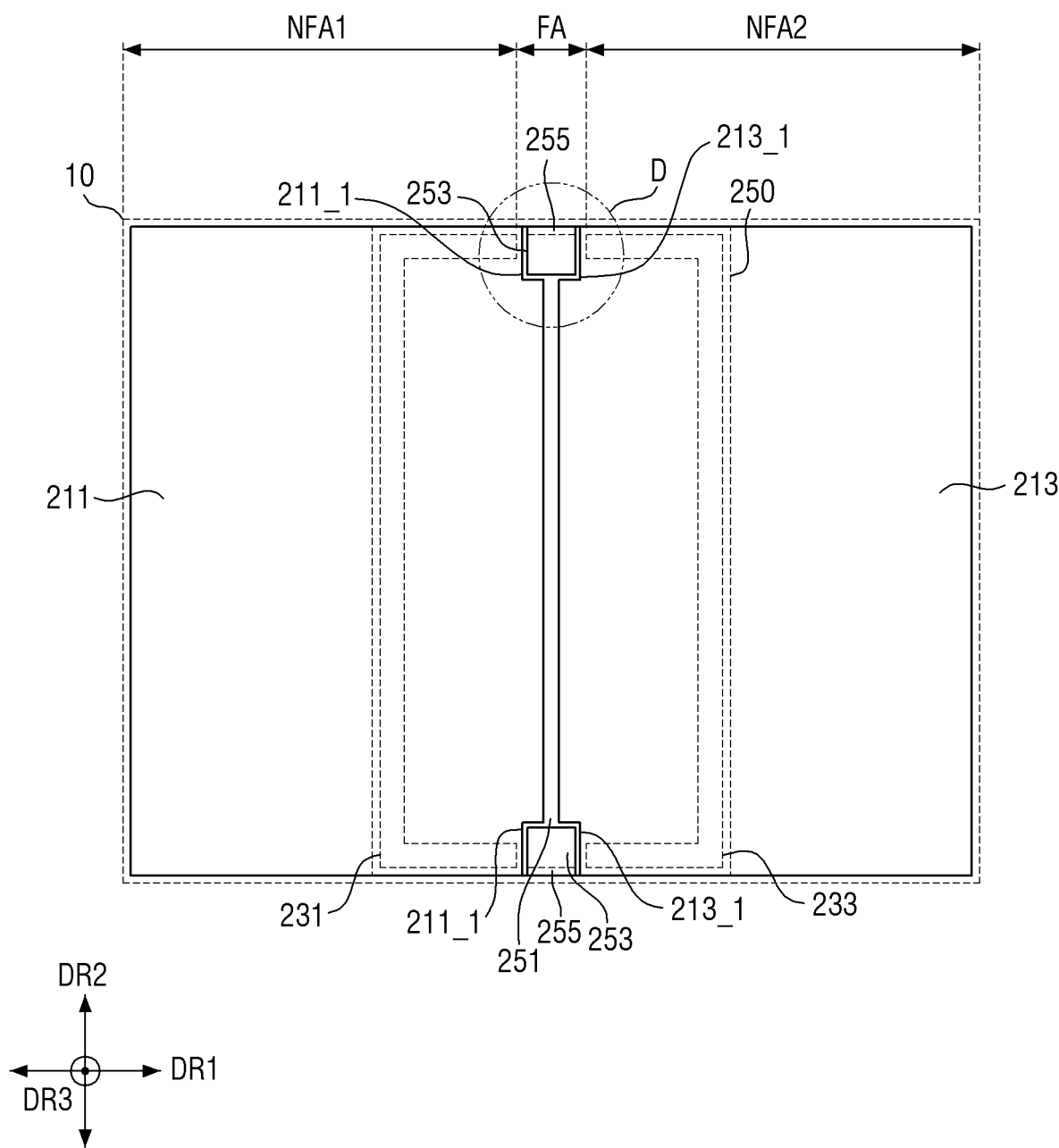
FIG. 8 is a plan view of the support member, the barrier sheet, and the adhesive member of FIG. 6 viewed from the front direction of the display panel.
Figure 9:
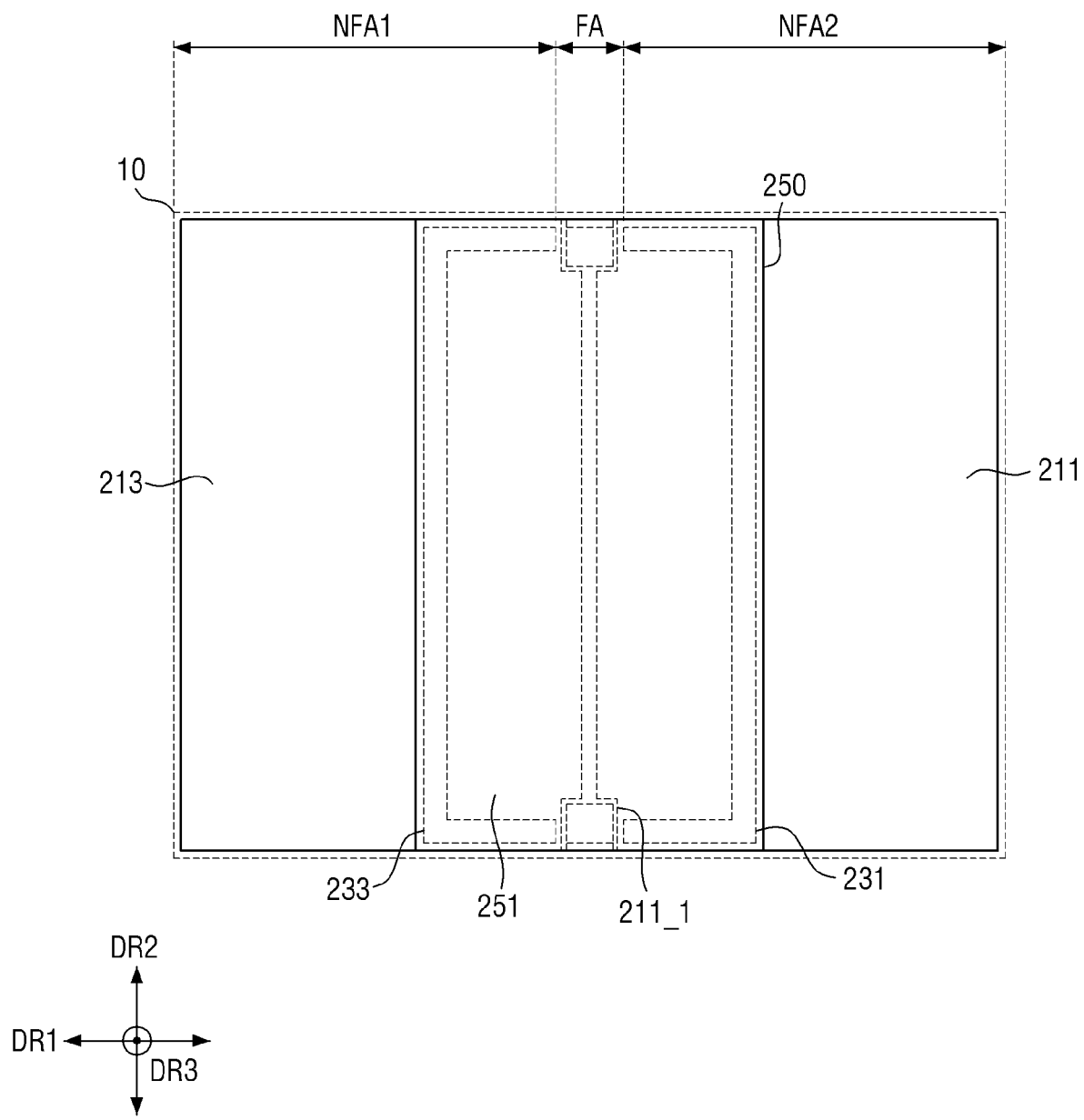
FIG. 9 is a plan view of the support member, the barrier sheet, and the adhesive member of FIG. 6 viewed from the back direction of the display panel.

FIG. 6 is a perspective view of a support member, a barrier sheet, and an adhesive member of the foldable display of FIG. 1, FIG. 7 is an enlarged perspective view of portion D of FIG. 6, FIG. 8 is a plan view of the support member, the barrier sheet, and the adhesive member of FIG. 6 viewed from the front direction of the display panel, and FIG. 9 is a plan view of the support member, the barrier sheet, and the adhesive member of FIG. 6 viewed from the back direction of the display panel.

For convenience of description, the connection portion 270 and the back cover 290 are not shown in FIGS. 6, 7, 8, and 9. In FIG. 7 and FIG. 9, the boundary or member not shown by another member is indicated by dotted lines.

Hereinafter, a direction toward a space between the first support member 211 and the second support member 213 is referred to as one side direction, and an opposite direction of the one side direction is referred to as the other side direction.

FIGS. 6, 7, 8, and 9 show the support member 210, the barrier sheet 250, and the adhesive member 230 of the foldable display device in an unfolded state.

Referring to FIGS. 4, 6, 7, 8, and 9, the first support member 211 and the second support member 213 are disposed on the back surface of the display module 10. The first support member 211 and the second support member 213 may be disposed in the back surface of the display module 10. In some exemplary embodiments, the first support member 211 and the second support member 213 may be disposed to protrude from the edge of the back surface of the display module 10. In some exemplary embodiments, the edges of the first support member 211 and the second support member 213 may be disposed to overlap the edge of the display module 10.

The width of each of the first support member 211 and the second support member 213 in the second direction DR2 may be smaller than the width of the back cover 290 in the second direction DR2 or the width of the hinge portion in the second direction DR2.

The first support member 211 and the second support member 213 may be disposed over the folding area FA and the non-folding areas NFA1 and NFA2. Specifically, the first support member 211 and the second support member 213 may be disposed such that edges adjacent to the folding axis FX extend in one side direction and partially overlap the folding area FA.

Each of the first support member 211 and the second support member 213 may include a first groove portion 211_1 and a second groove portion 213_1.

The first groove portion 211_1 and the second groove portion 213_1 are disposed at the corners of the first support member 211 and the second support member 213. Specifically, the first groove portion 211_1 is disposed at a corner located in one side direction of the first support member 211, and the second groove portion 213_1 is located at a corner located in one side direction of the second support member 213.

The first groove portion 211_1 and the second groove portion 213_1 may be disposed to at least partially overlap the folding area FA. In FIGS. 6, 7, and 8, the first groove portion 211_1 and the second groove portion 213_1 are disposed in the folding area FA, but the exemplary embodiments are not limited thereto. In some exemplary embodiments, the first groove portion 211_1 and the second groove portion 213_1 may be disposed over the folding area FA and the non-folding areas NFA1 and NFA2. The first groove portion 211_1 and the second groove portion 213_1 may be symmetrically disposed with respect to the first support member 211 and the second support member 213, respectively, based on a space between the first support member 211 and the second support member 213. Alternatively, the first support member 211 and the second support member 213 may include groove portions having different shapes and sizes.

Hereinafter, an exemplary embodiment in which the first groove portion 211_1 and the second groove portion 213_1 are disposed symmetrically with respect to the first support member 211 and the second support member 213 will be described. The description of the first groove portion 211_1 may be identically or similarly applied to the second groove portion 213_1.

The first groove portion 211_1 may be formed such that the corner of the first support member 211 is recessed inwardly. Specifically, the first groove portion 211_1 may be formed by recessing the side surface of the corner in one direction of the first support member 211 in the other side direction than the side surface of the center in the one side direction of the first support member 211. For example, the first groove portion 211_1 may be formed in an L shape at the corner of the first support member 211 in the one side direction.

A plurality of first groove portions 211_1 may be arranged. The plurality of first groove portions 211_1 may be symmetrically disposed with respect to both corners of the first support member 211 in the one side direction based on a virtual axis in the first direction DR1.

The first groove portion 211_1 and the second groove portion 213_1 may be disposed to overlap a cover portion 251 of the barrier sheet 250 to be described later. An overlapping portion 253 of the barrier sheet 250, which will be described later, may be inserted between the first groove portion 211_1 and the second groove portion 213_1.

For example, the first groove portion 211_1 and the second groove portion 213_1 may be replaced by a first chamfer portion and a second chamfer portion including an inclined surface or a curved surface forming a predetermined angle with the first direction DR1 and the second direction DR.

The first groove portion 211_1 and the second groove portion 213_1 may include first side surfaces 211_S1 and 213_S1 and second side surfaces 211_S2 and 213_S2, respectively.

The first side surfaces 211_S1 and 213_S1 extend along the first direction DR1. The width of each of the first side surfaces 211_S1 and 213_S1 in the first direction DR1 may be smaller than half the width of the folding area FA.

The first side surfaces 211_S1 and 213_S1 may be disposed inside the adhesive member 230. Specifically, the first side surfaces 211_S1 and 213_S1 may be spaced apart from the edge of the display module 10 or the barrier sheet 250 in the second direction DR2 than the adhesive member 230 disposed along the circumference of the cover portion 251 of the barrier sheet 250

For example, the width of each of the first side surfaces 211_S1 and 213_S1 may be about 1 mm to about 4 mm.

The second side surfaces 211_S2 and 213_S2 extend along the second direction DR2. The second side surfaces 211_S2 and 213_S2 may be disposed in the folding area FA.

The width of each of the second side surfaces 211_S2 and 213_S2 may be larger than the width of a portion of the adhesive member 230 disposed along the first direction DR1. Alternatively, unlike that shown in FIGS. 6, 7, 8, and 9, the width of each of the second side surfaces 211_S2 and 213_S2 may be substantially equal to or smaller than the width of the portion of the adhesive member 230 disposed along the first direction DR1.

For example, the width of each of the second side surfaces 211_S2 and 213_S2 may be about 1 mm to about 4 mm.

At least one of the first side surfaces 211_S1 and 213_S1 or the second side surfaces 211_S2 and 213_S2 may be disposed to be spaced apart from the overlapping portion 253 of the barrier sheet 250 to be described later. For example, the second side surfaces 211_S2 and 213_S2 may be in close contact with the overlapping portion 253 of the barrier sheet 250, but the first side surfaces 211_S1 and 213_S1 may be spaced apart from the overlapping portion 253 of the barrier sheet 250 by considering about the pressing of members and the variation of the spacing between the members according to the folding.

The width of each of the first side surfaces 211_S1 and 213_S1 in the first direction DR1 may be substantially equal to or less than the width of each of the second side surfaces 211_S2 and 213_S2 in the second direction DR2. For example, the width of each of the first side surfaces 211_S1 and 213_S1 may be about 1 mm or more and about 2 mm or less, and the width of each of the second side surfaces 211_S2 and 213_S2 may be more than about 2 mm and about 4 mm or less.

The barrier sheet 250 may include a cover portion 251 and an extension portion.

The cover portion 251 of the barrier sheet 250 is disposed over at least a part of the back surface of the first support member 211 and at least a part of the back surface of the second support member 213 to cover the back surface of the display module 10 exposed between the first support member 211 and the second support member 213.

The cover portion 251 of the barrier sheet 250 may be disposed over the folding area FA and the non-folding areas NFA1 and NFA2. Specifically, the cover portion 251 of the barrier sheet 250 may be disposed to cover the entire folding area FA and cover a part of each of the first non-folding area NFA1 and the second non-folding area NFA2. For example, the cover portion 251 of the barrier sheet 250 may be disposed to cover only the folding area FA.

The width of the cover portion 251 of the barrier sheet 250 in the second direction DR2 may be substantially equal to or less than the width of the first support member 211 or the second support member 213 in the second direction DR2. For example, the width of the cover portion 251 in the second direction DR2 may be smaller than the width of the first support member 211 or the second support member 213 in the second direction DR2.

The extension portion of the barrier sheet 250 is disposed on the folding axis FX and extends along the direction of the folding axis FX. The extension portion of the barrier sheet 250 may be extended from the edge of the barrier sheet 250 to the outside.

The extension portion of the barrier sheet 250 may include an overlapping portion 253 and a bending portion 255.

The overlapping portion 253 of the extension portion of the barrier sheet 250 is disposed adjacent to the edge of the cover portion 251 extending along the first direction DR1 and overlaps the front surface of the cover portion 251 in the thickness direction (e.g., the third direction DR3). The overlapping portion 253 may be disposed to be spaced apart from the front surface of the cover portion 251, e.g., in the third direction DR3. In some exemplary embodiments, the overlapping portion 253 may be disposed to closely contact the cover portion 251.

The overlapping portion 253 of the barrier sheet 250 may be disposed between the first groove portion 211_1 and the second groove portion 213_1, e.g., in the first direction DR1. Specifically, the overlapping portion 253 may be disposed between the second side surface 211_S2 of the first groove portion 211_1 and the second side surface 213_S2 of the second groove portion 213_1.

The overlapping portion 253 of the barrier sheet 250 may be disposed in the folding area FA. Unlike that shown in FIGS. 6, 7, 8, and 9, the overlapping portion 253 may be disposed over the folding area FA and the non-folding areas NFA1 and NFA2.

The width of the overlapping portion 253 of the barrier sheet 250 in the first direction DR1 may be greater than the distance between the first support member 211 and the second support member 213. Specifically, the width of the overlapping portion 253 in the first direction DR1 may be larger than the distance between the side surfaces disposed at the outermost of the first support member 211 and the second support member 213.

At least a part of the overlapping portion 253 of the barrier sheet 250 may be spaced apart from the first groove portion 211_1 and the second groove portion 213_1. For example, the width of the overlapping portion 253 in the first direction DR1 may be smaller than the distance between the second side surface 211_S2 of the first groove portion 211_1 and the second side surface 213_S2 of the second groove portion 213_1 in the first direction DR1. As another example, the width of the overlapping portion 253 in the second direction DR2 may be smaller than the width of the first side surfaces 211_S1 and 213_S1 of the first groove portion 211_1 or the first side surfaces 211_S1 and 213_S1 of the second groove portion 213_1 in the second direction DR2. The overlapping portion 253 may be in close contact with the first side surfaces 211_S1 and 213_S1, and may be spaced apart from the second side surfaces 211_S2 and 213_S2.

The overlapping portion 253 of the barrier sheet 250 may be attached to the back surface of the display module 10. Unlike that shown in FIGS. 6, 7, 8, and 9, the overlapping portion 253 may not be attached to the back surface of the display module 10.

The folding member 20 may further include an adhesive layer 260 between the front surface of the overlapping portion 253 and the back surface of the display module 10.

The bending portion 255 of the extension portion of the barrier sheet 250 connects the cover portion 251 and the overlapping portion 253 in the thickness direction (e.g., the third direction DR3). Specifically, the bending portion 255 has a U-shaped structure having an open side. For example, the open side of the bending portion 255 may face toward the center of the foldable display device, and may face between the cover portion 251 and the overlapping portion 253. For example, one end the bending portion 255 may be connected to the cover portion 251, and the other end the bending portion 255 may be connected to the overlapping portion 253. For example, the bending portion 255 may be bent outwardly.

The bending portion 255 of the extension portion of the barrier sheet 250 may be bent in the second direction DR2 to connect a portion of the other edge of the cover portion 251 extending along the first direction DR1 and the other edge of the overlapping portion 253 extending along the first direction DR1. The other edges of the overlapping portion 253 may be edges closest to the edges of the display module 10 extending along the first direction DR1.

The width of the bending portion 255 of the extension portion of the barrier sheet 250 in the first direction DR1, may be substantially equal to the width of the overlapping portion 253 in the first direction DR1. In some exemplary embodiments, the width of the bending portion 255 in the first direction DR1 may be greater than the width of the overlapping portion 253 in the first direction DR1. In some exemplary embodiments, the width of the bending portion 255 may be substantially equal to or less than the distance between the second side surface 211_S2 of the first groove portion 211_1 and the second side surface 213_S2 of the second groove portion 213_1.

The cover portion 251, the overlapping portion 253, and the bending portion 255 of the barrier sheet 250 may be integrally formed. Specifically, the bending portion 255 may protrude from the edge of the cover portion 251 to have a predetermined width, and the overlapping portion 253 may extend from an end portion of the bending portion 255 in the second direction DR2. For example, the bending portion 255 may be bent or folded such that the overlapping portion 253 and/or the bending portion 255 are inserted between the first support member 211 and the second support member 213, e.g., in the first direction DR1. Alternatively, the cover portion 251, the overlapping portion 253, and the bending portion 255 of the barrier sheet 250 may be separate members connected to each other.

The adhesive member 230 may include a first adhesive member 231 and a second adhesive member 233.

The first adhesive member 231 is disposed between the first support member 211 and the barrier sheet 250. The second adhesive member 233 is disposed between the second support member 213 and the barrier sheet 250.

The first adhesive member 231 and the second adhesive member 233 may be spaced apart from each other, e.g., in the first direction DR1. For example, the first adhesive member 231 may be disposed in the first non-folding area NFA1, and the second adhesive member 233 may be disposed in the second non-folding area NFA2. The first adhesive member 231 and the second adhesive member 233 may be disposed only in an area corresponding to the non-folding areas NFA1 and NFA2 of the barrier sheet 250 and the support member 210.

The first adhesive member 231 and the second adhesive member 233 may be disposed along at least a part of the circumference of the barrier sheet 250. For example, the first adhesive member 231 and the second adhesive member 233 may have a U shape or a H shape having an open side in plan view. For example, the first adhesive member 231 and the second adhesive member 233 may be disposed such that the open sides thereof face each other toward the folding axis FX based on a space between the first support member 211 and the second support member 213. The first adhesive member 231 and the second adhesive member 233 may be spaced apart from each other with the overlapping portion 253 and/or the bending portion 255 interposed therebetween.

The first adhesive member 231 and the second adhesive member 233 may be spaced apart from the circumference of the barrier sheet 250 by a predetermined distance. The second side surfaces 211 S2 and 213 S2 and the overlapping portion 253 may be disposed between the first adhesive member 231 and the second adhesive member 233. The first adhesive member 231 and the second adhesive member 233 may be spaced apart from the second side surfaces 211_S2 and 213 S2 by a predetermined distance.

The first adhesive member 231 and the second adhesive member 233 may be symmetrically disposed based on the first support member 211 and the second support member 213.

Hereinafter, the coupling relationship among the display module 10, the support member 210, the adhesive member 230, and the barrier sheet 250 will be described in detail with reference to FIGS. 10, 11, 12, 13, 14, and 15.

Figure 10:
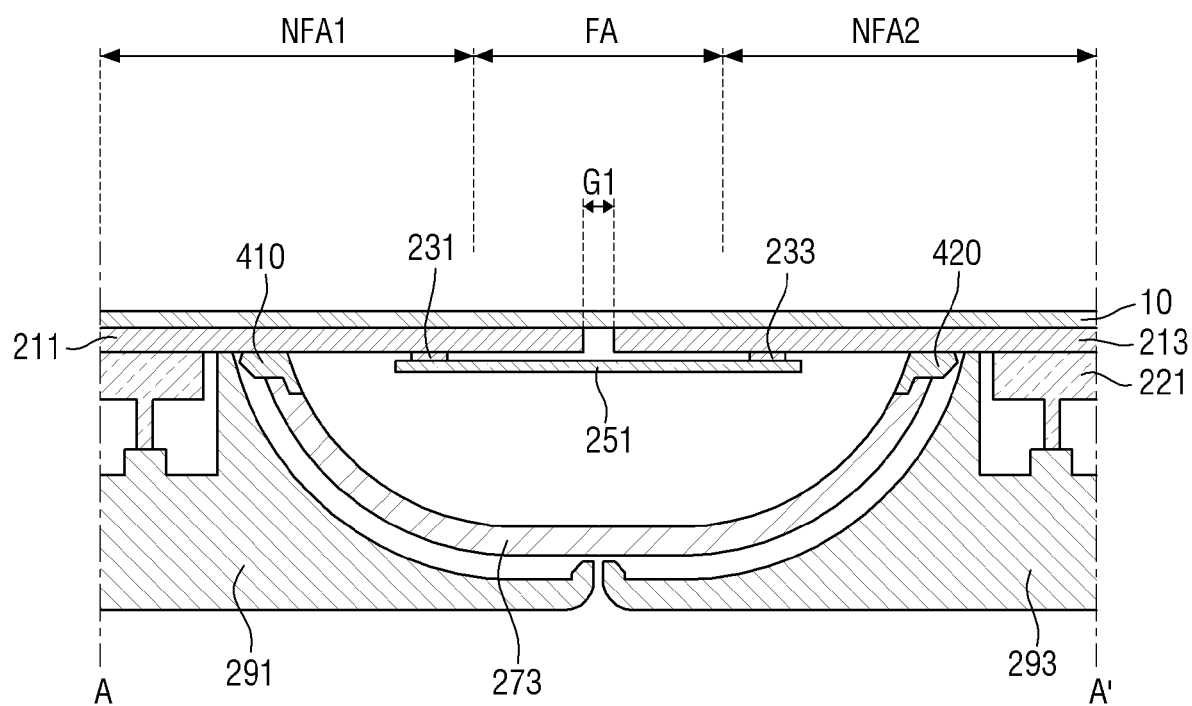
FIG. 10 is a cross-sectional view taken along the line A-A' of FIG. 6 in an unfolded state.
Figure 10:
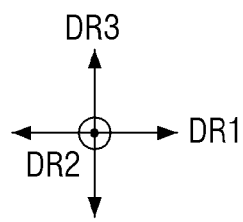
Figure 11:
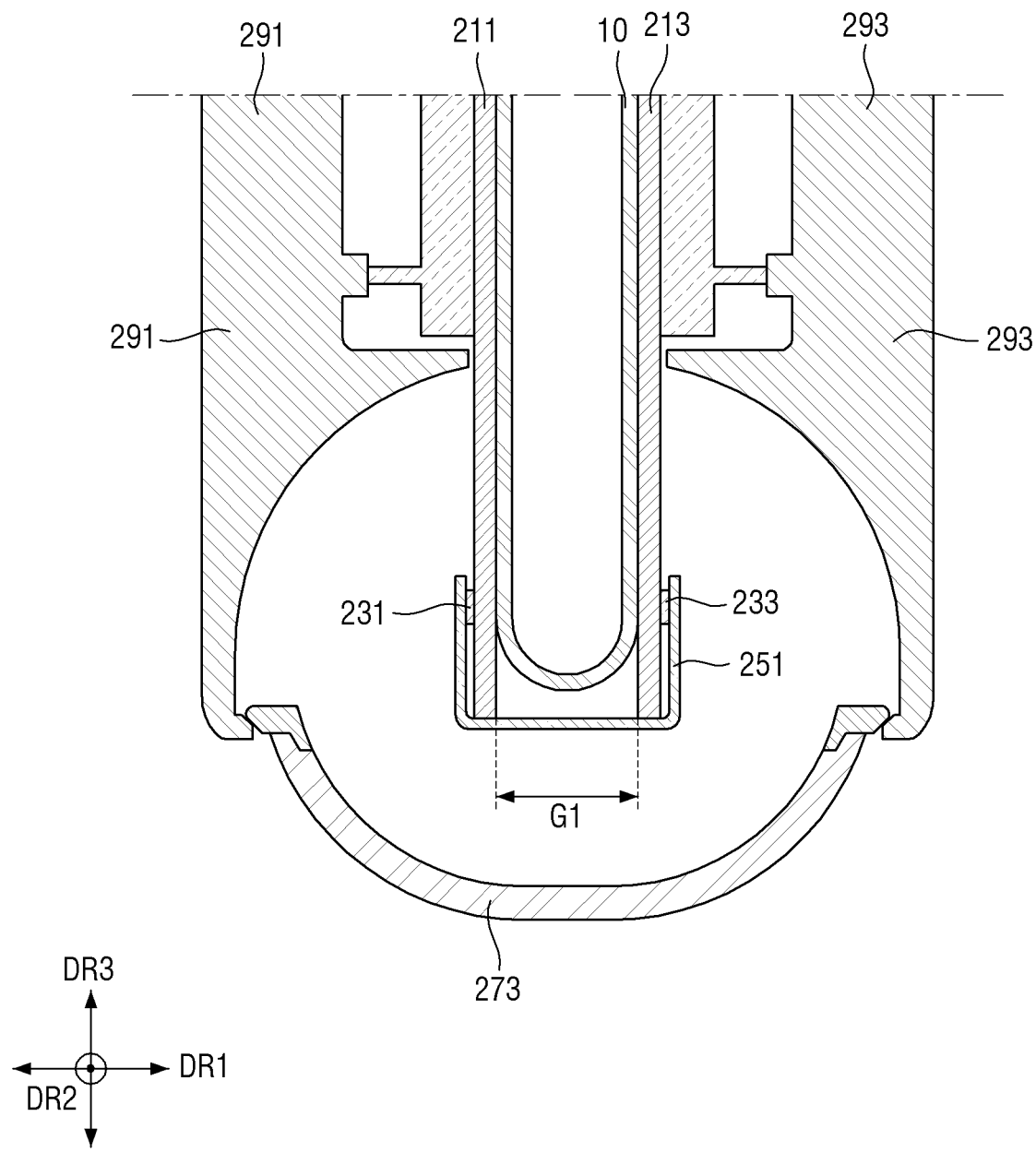
FIG. 11 is a cross-sectional view taken along the line A-A' of FIG. 6 in a folded state.
Figure 12:
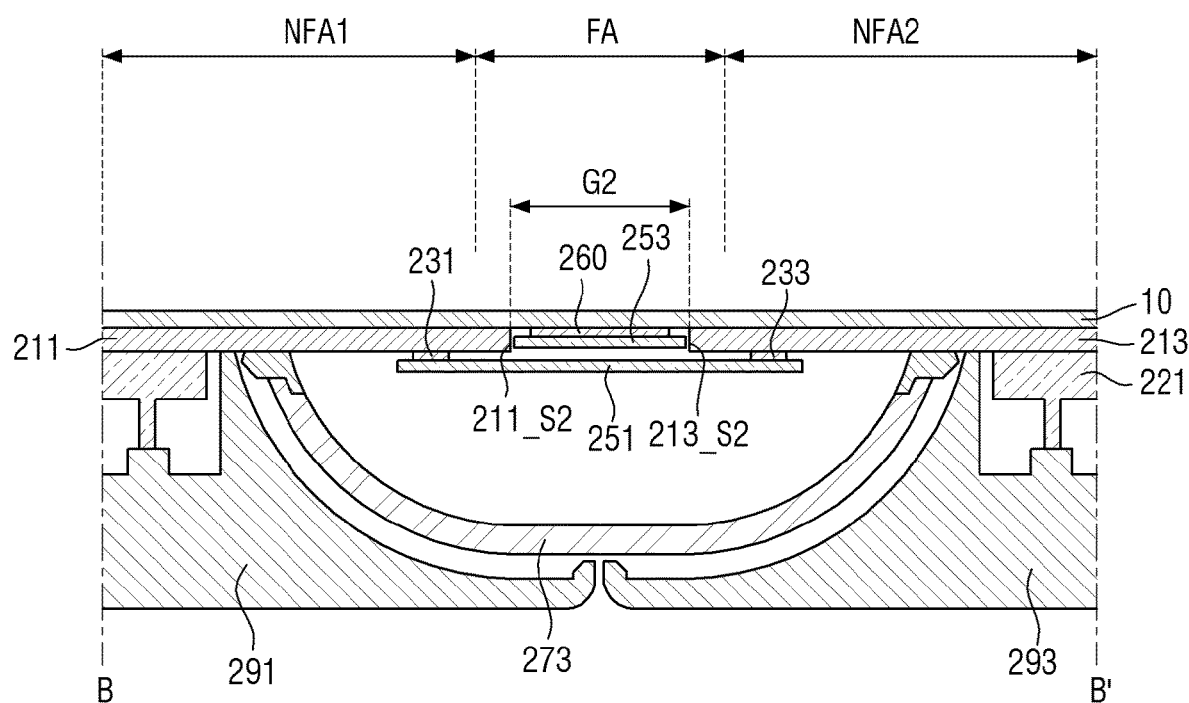
FIG. 12 is a cross-sectional view taken along the line B-B' of FIG. 6 in an unfolded state.
Figure 12:
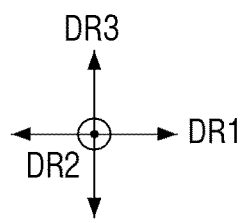
Figure 13:
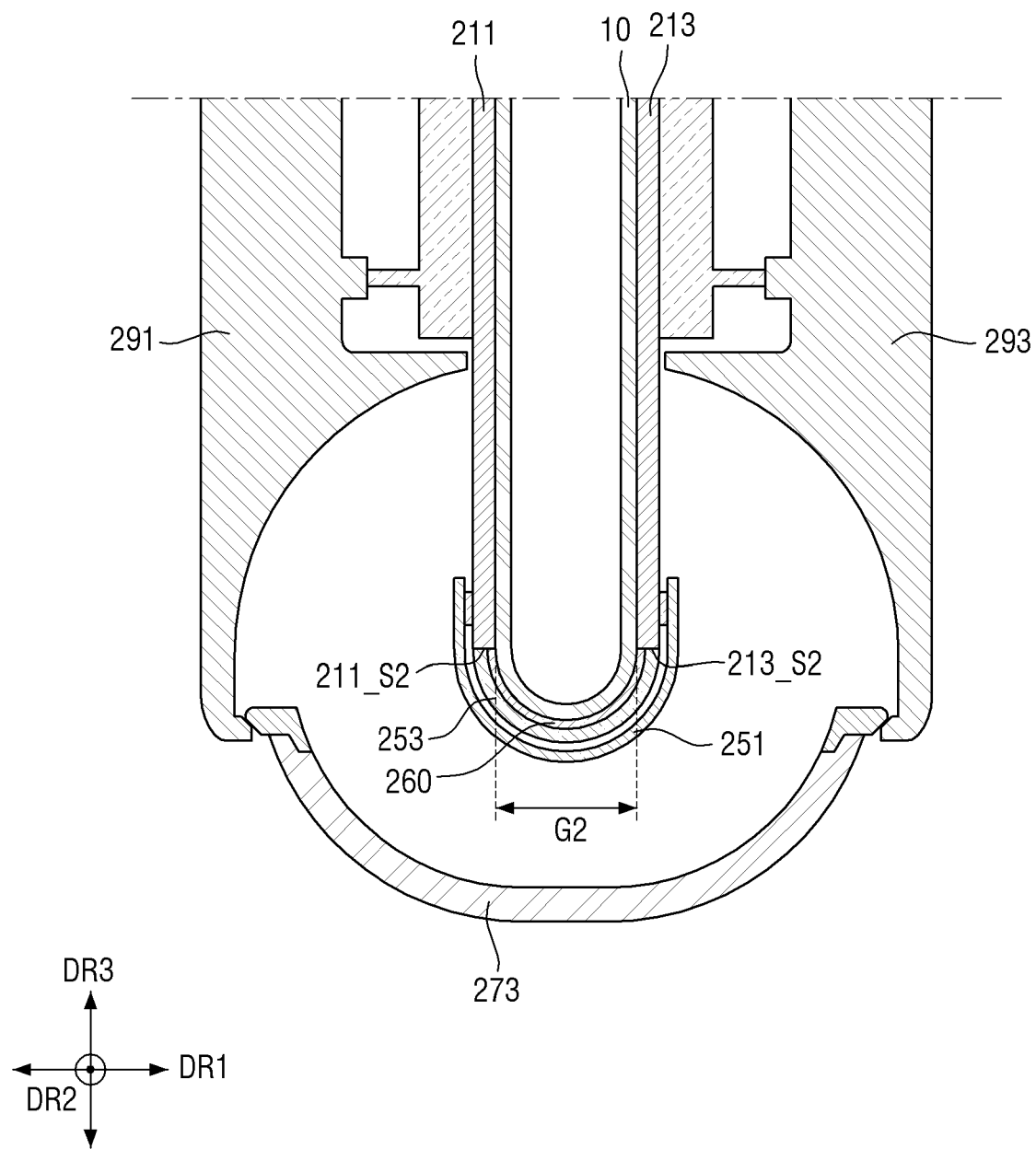
FIG. 13 is a cross-sectional view taken along the line B-B' of FIG. 6 in a folded state.
Figure 15:
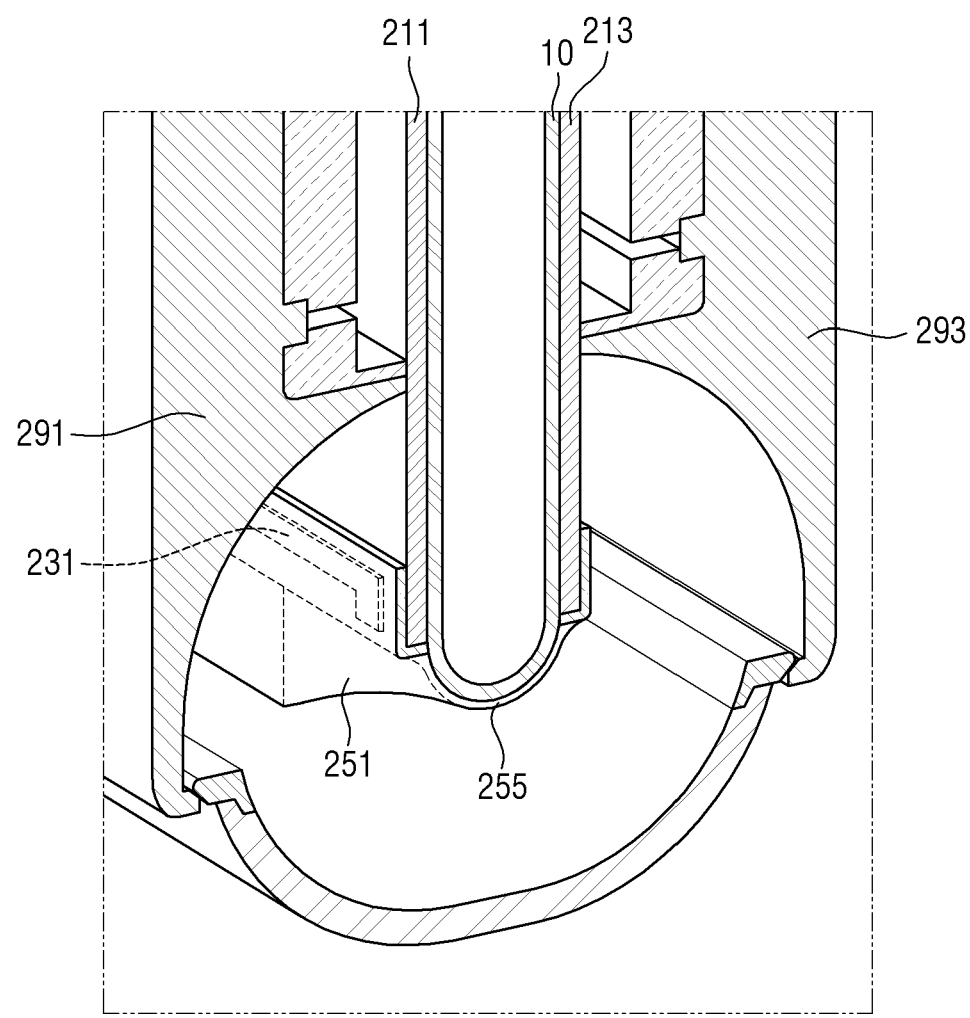
FIG. 15 is a cross-sectional view illustrating a bending portion of another exemplary embodiment of a foldable display device constructed according to the principles of the invention.

FIGS. 10 and 11 are cross-sectional views taken along line A-A' of FIG. 6. FIGS. 12 and 13 are cross-sectional views taken along line B-B' of FIG. 6. FIGS. 15 and 16 are cross-sectional views taken along line C-C' of FIG. 6.

Hereinafter, for convenience of description, the minimum distance between the first support member 211 and the second support member 213 in the first direction DR1 is referred to as a first gap G1, and the distance between the second side surface 211_S2 of the first groove portion 211_1 and the second side surface 213_S2 of the second groove portion 213_1 in the first direction DR1 is referred to as a second gap G2. The first gap G1 may be a gap between side surfaces disposed at the outermost side of each of the first support member 211 and the second support member 213 in one side direction.

FIG. 10 is a cross-sectional view taken along the line A-A' of FIG. 6 in an unfolded state, and FIG. 11 is a cross-sectional view taken along the line A-A' of FIG. 6 in a folded state.

Referring to FIGS. 10 and 11, the first support member 211 and the second support member 213 are attached to the back surface of the display module 10. For example, at least one member or layer for adhesion may be disposed between the support member 210 and the display module 10.

As shown in FIG. 11, portions disposed in the folding area FA of the first and second support members 211 and 213 may be attached to the back surface of the display module 10, and portions disposed in the non-folding areas NFA1 and NFA2 of the first and second support members 211 and 213 may not be attached to the back surface of the display module 10. Accordingly, a portion disposed in the non-folding areas NFA1 and NFA2 in an unfolded state may be in close contact with the back surfaces of the non-folding areas NFA1 and NFA2 of the display module 10 to support the display module 10. Further, a portion disposed in the non-folding areas NFA1 and NFA2 in a folded state may be spaced apart from the back surface of the display module 10 such that the display module 10 has a radius of curvature.

The width of each of the first support member 211 and the second support member 213 in the first direction DR1 may be greater than the width of the hinge cover 273 in the first direction DR1. Accordingly, the first support member 211 and the second support member 213 may be disposed over the hinge cover 273 in an unfolded state.

The first support member 211 and the second support member 213 are arranged to form the first gap G1 in an unfolded state. As shown in FIG. 10, the first gap G1 may be smaller than the width of the folding area FA in the first direction DR1. As shown in FIG. 11, as the first support member 211 and the second support member 213 are folded, the first gap G1 between the first support member 211 and the second support member 213 in the first direction DR1 may be increased.

The cover portion 251 of the barrier sheet 250 is disposed over the back surface of the first support member 211 and the back surface of the second support member 213 to cover the variable first gap G1. Specifically, as the first support member 211 and the second support member 213 are folded or unfolded, the cover portion 251 may be stretched and shrunk in the first direction DR1. Accordingly, a part of the back surface of the display module 10 exposed downward (e.g., in the third direction DR3) between the first support member 211 and the second support member 213 may be covered by the cover portion 251.

The width of the cover portion 251 in the first direction DR1 may be greater than the first gap G1. The width of the cover portion 251 in the first direction DR1 may be smaller than the width of the hinge member in the first direction DR1. The cover portion 251 may be accommodated in an inner space formed by the hinge cover 273 and the back cover 290 in a folded state and an unfolded state.

The cover portion 251 may be attached to the support member 210 by the adhesive member 230. Specifically, at least a part of the front surface adjacent to one side edge of the cover portion 251 in the first direction DR1 may be attached to the first support member 211 by the first adhesive member 231, and another part of the front surface adjacent to the other side edge of the cover portion 251 in the first direction DR1 may be attached to the second support member 213 by the second adhesive member 233.

The cover portion 251 may prevent the penetration of foreign matter. Specifically, the cover portion 251 may prevent foreign matter penetrating between the hinge cover 273 and the back cover 290 from penetrating back into the space between the display panel and the cover portion 251.

Figure 14:
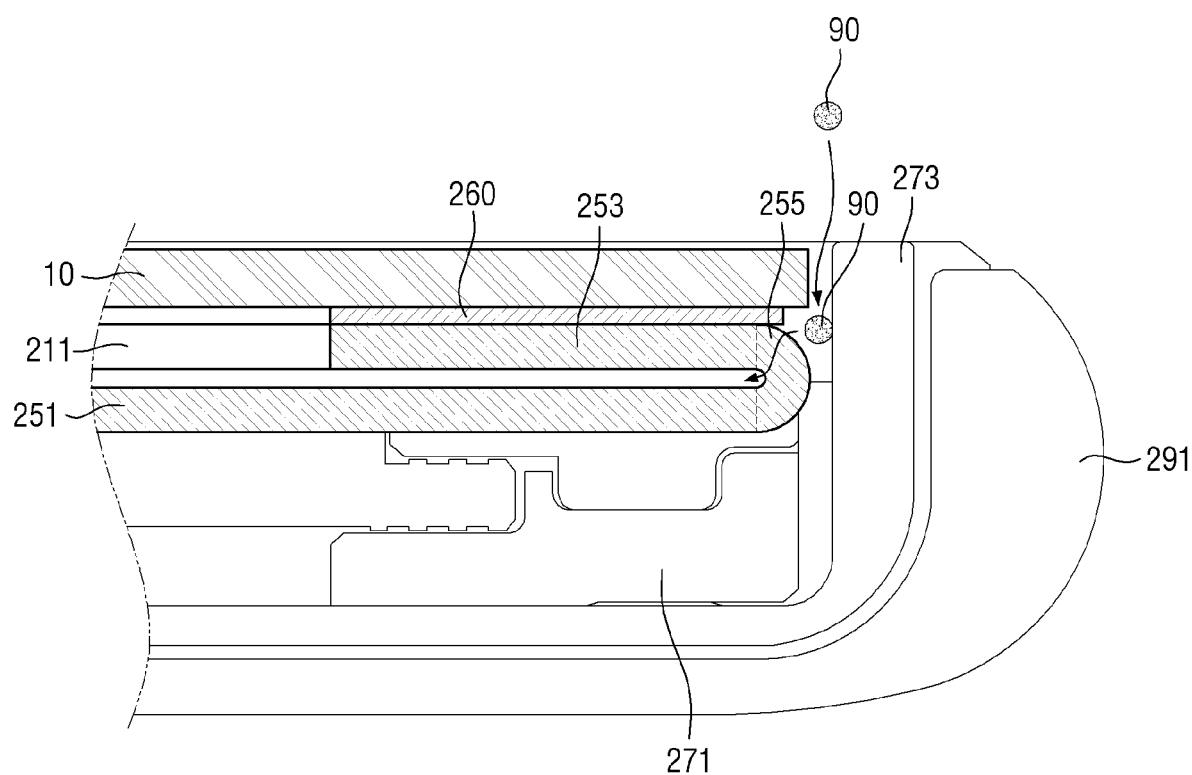
FIG. 14 is a cross-sectional view taken along the line C-C' of FIG. 6 in an unfolded state.
Figure 14:
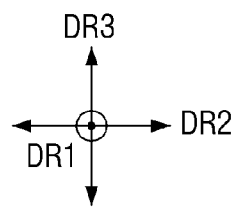

FIG. 12 is a cross-sectional view taken along the line B-B' of FIG. 6 in an unfolded state, FIG. 13 is a cross-sectional view taken along the line B-B' of FIG. 6 in a folded state, FIG. 14 is a cross-sectional view taken along the line C-C' of FIG. 6 in an unfolded state, and FIG. 15 is a cross-sectional view illustrating a bending portion of another exemplary embodiment of a foldable display device constructed according to the principles of the invention.

Referring to FIGS. 12, 13, 14, and 15, as described above, the first support member 211 and the second support member 213 support the back surface of the display module 10.

As a groove is formed at one side edge of the first support member 211 and the second support member 213, a second gap G2 may be formed between the first support member 211 and the second support member 213. Accordingly, the distance between the first support member 211 and the second support member 213 in an unfolded state may vary according to the distance in the second direction DR2 from the short side of the first support member 211 or the second support member 213 in the first direction DR1. The second gap G2 may be greater than the first gap G1.

The overlapping portion 253 of the barrier sheet 250 may be disposed between the display module 10 and the cover portion 251. As described above, the overlapping portion 253 may be attached to the display module 10 by the adhesive layer 260, and the cover portion 251 may be attached to the support member 210 by the adhesive member 230. The adhesive layer 260 may be disposed in the front surface of the overlapping portion 253.

The overlapping portion 253 may be spaced apart from the second side surfaces 211_S2 and 213_S2. At least a part of the overlapping portion 253 may be disposed to overlap the first side surfaces 211_S1 and 213_S1 or the second side surfaces 211_S2 and 213_S2 in the first direction DR1 or the second direction DR2.

The overlapping portion 253 may be spaced apart from the cover portion 251 in the thickness direction (e.g., the third direction DR3). The overlapping portion 253 may be thinner than the support member 210. Referring to FIG. 11, the overlapping portion 253 may be spaced apart from the cover portion 251 in an unfolded state and may be in close contact with the cover portion 251 in a folded state.

The overlapping portion 253 and the cover portion 251 may have different curvatures in the folding state as they extend in the first direction DR1. Specifically, the curvature of the overlapping portion 253 may be greater than the curvature of the cover portion 251 in a folded state. For example, the radius of the curvature of the overlapping portion 253 may be smaller than the radius of the curvature of the cover portion 251 in a folded state.

Referring to FIGS. 14 and 15, the bending portion 255 covers the gap between the overlapping portion 253 and the cover portion 251. The bending portion 255 prevents the foreign matter penetrating between the display module 10 and the hinge cover 273 from penetrating back into the space between the overlapping portion 253 and the cover portion 251, moreover, the space between support member 210 and the barrier sheet 250.

The outermost end of the bending portion 255 may be disposed in substantially parallel with the edge of the display module 10 or the edge of the support member 210 in the third direction DR3. In some exemplary embodiments, the bending portion 255 may protrude outwardly beyond an edge of the display module 10 or the support member 210 in the first direction DR1. The bending portion 255 may be in contact with the hinge cover 273 to prevent the foreign matter introduced between the hinge cover 273 and the display module 10 from penetrating back into the connection portion 270 or the hinge portion. In some exemplary embodiments, the bending portion 255 may be disposed so as not to protrude outwardly beyond the display module 10 or the support member 210.

According to an exemplary embodiment, it is possible to prevent the penetration of foreign matter through a gap formed between members.

The effects of the present invention are not limited by the foregoing, and other various effects are anticipated herein.

Although the exemplary embodiments have been disclosed for illustrative purposes, those skilled in the art will appreciate that various modifications, additions and substitutions are possible, without departing from the scope and spirit of the invention as disclosed in the accompanying claims.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A foldable display device having a first non-folding area and a second non-folding area with a folding axis therebetween, the foldable display device comprising:
   a display panel;
   a first support member disposed on a back surface of the display panel and in the first non-folding area;
   a second support member disposed on a back surface of the display panel and in the second non-folding area, the second support member spaced apart from the first support member; and
   a barrier sheet disposed on back surfaces of the first support member and the second support member to overlap the first non-folding area, the folding axis, and the second non-folding area,
   wherein the barrier sheet is disposed on the folding axis and includes an extension portion extending along a direction of the folding axis, and wherein:
   the first support member includes a first groove portion formed at a corner of the first is support member adjacent to the folding axis, and
   the second support member includes a second groove portion formed at a corner of the second support member adjacent to the folding axis.

2. The foldable display device of claim 1, wherein the extension portion of the barrier sheet is bent to be accommodated in a space defined by the first groove portion of the first support member and the second groove portion of the second support member.

3. The foldable display device of claim 2, wherein the barrier sheet further includes a cover portion covering a space between the first support member and the second support member, and the extension portion of the barrier sheet includes an overlapping portion disposed to overlap the cover portion in a thickness direction of the cover portion, and a bending portion connecting the cover portion and the overlapping portion in the thickness direction.

4. The foldable display device of claim 3, wherein the bending portion of the barrier sheet is bent in a direction intersecting the folding axis.

5. The foldable display device of claim 3, wherein the bending portion of the barrier sheet has a U-shaped structure having one open side facing toward a center of the foldable display device or facing between the cover portion and the overlapping portion, and has one end connected to the cover portion and another end connected to the overlapping portion.

6. The foldable display device of claim 3, wherein the bending portion of the barrier sheet covers a gap between the display panel and the cover portion in the thickness direction.

7. The foldable display device of claim 3, wherein the bending portion of the barrier sheet protrudes outwardly beyond an edge of the display panel.

8. The foldable display device of claim 3, wherein the cover portion, the overlapping portion, and the bending portion of the barrier sheet are folded or unfolded according to a variation of an angle between the first support member and the second support member.

9. The foldable display device of claim 3, wherein the cover portion of the barrier sheet is attached to back surfaces of the first support member and the second support member, and the overlapping portion of the barrier sheet is attached to a back surface of the display panel.

10. The foldable display device of claim 9, further comprising:
a first adhesive member disposed between the first support member and the barrier sheet; and
a second adhesive member disposed between the second support member and the barrier sheet.

11. The foldable display device of claim 10, wherein the first adhesive member and the second adhesive member are disposed along an edge of the cover portion of the barrier sheet with the overlapping portion therebetween.

12. The foldable display device of claim 9, further comprising:
an adhesive layer disposed between the overlapping portion of the barrier sheet and the display panel to attach an upper surface of the overlapping portion of the barrier sheet to a lower surface of the display panel.

13. The foldable display device of claim 1, wherein each of the first groove portion and the second groove portion includes a first side surface extending along a direction intersecting the direction of the folding axis and a second side surface extending along the direction of the folding axis.

14. The foldable display device of claim 13, wherein the extension portion of the barrier sheet is spaced apart from the first side surface and is in contact with the second side surface.

15. The foldable display device of claim 1, further comprising:
a connection portion disposed in a back direction of the barrier sheet and connecting the first support member and the second support member, the connection portion configured to change an angle between the first support member and the second support member.

16. The foldable display device of claim 15, wherein the connection portion further includes a hinge structure having at least one rotation axis and a hinge cover covering the hinge cover;
the barrier sheet is disposed inside the hinge cover; and
the extension portion of the barrier sheet covers a gap between an edge of the display panel and an inner side surface of the hinge cover.

17. A foldable display device, comprising:
a display panel;
a first support member and a second support member disposed on a back surface of the display panel in a first direction; and
a barrier sheet disposed to overlap back surfaces of the first support member and the second support member and including an extension portion extending in a second direction intersecting the first direction,
wherein the first support member includes a first groove portion at one side corner of the first support member adjacent to the second support member,
the second support member includes a second groove portion at one side corner of the second support member adjacent to the first support member, and
the extension portion of the barrier sheet is bent to be disposed in a space defined by the first groove portion of the first support member and the second groove portion of the second support member.

18. The foldable display device of claim 17, wherein each of the first groove portion and the second groove portion includes a first side surface extending in the first direction, and a second side surface extending in the second direction.

19. The foldable display device of claim 17, further comprising:
a first adhesive member disposed between the first support member and the barrier sheet; and
a second adhesive member disposed between the second support member and the barrier sheet.

20. The foldable display device of claim 17, further comprising:
a connection portion connecting the first support member and the second support member, the connection portion configured to change an angle between the first support member and the second support member,
wherein the connection portion further includes a hinge structure having at least one rotation axis and a hinge cover covering the hinge cover, and
the barrier sheet is disposed inside the hinge cover.

* * * * *